United States Patent
Venugopal et al.

(10) Patent No.: US 10,181,521 B2
(45) Date of Patent: Jan. 15, 2019

(54) GRAPHENE HETEROLAYERS FOR ELECTRONIC APPLICATIONS

(71) Applicant: Texas Instruments Incorporated, Dallas, TX (US)

(72) Inventors: Archana Venugopal, Dallas, TX (US); Benjamin Stassen Cook, Rockwall, TX (US); Luigi Colombo, Dallas, TX (US); Robert Reid Doering, Garland, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 4 days.

(21) Appl. No.: 15/437,818

(22) Filed: Feb. 21, 2017

(65) Prior Publication Data

US 2018/0240886 A1    Aug. 23, 2018

(51) Int. Cl.
| | |
|---|---|
| *H01L 29/16* | (2006.01) |
| *H01L 29/66* | (2006.01) |
| *H01L 29/778* | (2006.01) |
| *H01L 23/66* | (2006.01) |
| *H01L 49/02* | (2006.01) |

(52) U.S. Cl.
CPC ........ *H01L 29/66045* (2013.01); *H01L 23/66* (2013.01); *H01L 28/40* (2013.01); *H01L 29/1606* (2013.01); *H01L 29/778* (2013.01); *H01L 2223/6677* (2013.01)

(58) Field of Classification Search
CPC ............... H01L 21/02518; H01L 21/04; H01L 21/0425; H01L 21/044; H01L 21/4814; H01L 29/68
See application file for complete search history.

(56) References Cited

U.S. PATENT DOCUMENTS

| | | | |
|---|---|---|---|
| 7,619,257 | B2 | 11/2009 | Pfeiffer |
| 7,927,978 | B2 | 4/2011 | Pfeiffer |
| 8,159,037 | B2 | 4/2012 | Woo |
| 8,513,653 | B2 | 8/2013 | Woo |
| 8,952,356 | B2 | 2/2015 | Kim |
| 9,029,228 | B2 | 5/2015 | Seacrist |
| 9,082,523 | B2 | 7/2015 | Ozyilmaz |
| 9,082,682 | B2 | 7/2015 | Kim |

(Continued)

FOREIGN PATENT DOCUMENTS

EP     3104414 A1    12/2016

OTHER PUBLICATIONS

International Search Report for PCT/US2018/019011 dated Jun. 21, 2018.

(Continued)

*Primary Examiner* — Cheung Lee
(74) *Attorney, Agent, or Firm* — Michael A. Davis, Jr.; Charles A. Brill; Frank D. Cimino (57) ABSTRACT

A microelectronic device includes an electrical conductor which includes a graphene heterolayer. The graphene heterolayer includes a plurality of alternating layers of graphene and barrier material. Each layer of the graphene has one to two atomic layers of graphene. Each layer of the barrier material has one to three layers of hexagonal boron nitride, cubic boron nitride, and/or aluminum nitride. The layers of graphene and the layers of barrier material may be continuous, or may be disposed in nanoparticles of a nanoparticle film.

16 Claims, 11 Drawing Sheets

(56) References Cited

U.S. PATENT DOCUMENTS

| | | |
|---|---|---|
| 9,144,962 B2 | 9/2015 | Lee |
| 9,257,509 B2 | 2/2016 | Shepard |
| 9,281,385 B2 | 3/2016 | Shin |
| 9,287,116 B2 | 3/2016 | Suh |
| 9,299,473 B2 | 3/2016 | Schmidt |
| 9,318,591 B2 | 4/2016 | Geim |
| 9,331,198 B2 | 5/2016 | Kelber |
| 9,355,842 B2 | 5/2016 | Seacrist |
| 9,410,243 B2 | 8/2016 | Sutter |
| 9,496,060 B2 | 11/2016 | Mikhailov |
| 2010/0055464 A1* | 3/2010 | Sung ............ B01J 21/18 428/408 |
| 2010/0218801 A1 | 9/2010 | Sung |
| 2011/0121264 A1 | 5/2011 | Choi |
| 2011/0163298 A1 | 7/2011 | Sung |
| 2012/0085991 A1 | 4/2012 | Cohen |
| 2012/0258587 A1 | 10/2012 | Kub |
| 2012/0325296 A1 | 12/2012 | Woo |
| 2013/0001515 A1 | 1/2013 | Li et al. |
| 2013/0015581 A1 | 1/2013 | Wann et al. |
| 2013/0048339 A1 | 2/2013 | Tour |
| 2013/0059143 A1 | 3/2013 | Liang |
| 2014/0008611 A1 | 1/2014 | Geim |
| 2014/0008616 A1 | 1/2014 | Geim et al. |
| 2014/0182646 A1 | 7/2014 | Choi |
| 2014/0264275 A1 | 9/2014 | Zhong |
| 2014/0367824 A1 | 12/2014 | Kub et al. |
| 2015/0108499 A1 | 4/2015 | Alptekin |
| 2015/0137930 A1 | 5/2015 | Li et al. |
| 2015/0214048 A1 | 7/2015 | Suh |
| 2015/0236234 A1 | 8/2015 | Pruneri |
| 2015/0318401 A1 | 11/2015 | Duan |
| 2016/0038971 A9 | 2/2016 | Wong |
| 2016/0225870 A1 | 8/2016 | Jacob |
| 2016/0240692 A1 | 8/2016 | Shepard |
| 2016/0260604 A1 | 9/2016 | Wang |
| 2016/0284811 A1 | 9/2016 | Yu |
| 2016/0351807 A1 | 12/2016 | Scheibner |
| 2017/0059514 A1 | 3/2017 | Hoffman |

OTHER PUBLICATIONS

International Search Report for PCT/US2018/019016 dated Jun. 21, 2018.

\* cited by examiner

GRAPHENE HETEROLAYERS FOR ELECTRONIC APPLICATIONS

FIELD OF THE DISCLOSURE

This disclosure relates to the field of microelectronic devices. More particularly, this disclosure relates to graphene heterolayers in microelectronic devices.

BACKGROUND OF THE DISCLOSURE

As microelectronic devices become denser and operate at higher speeds, metal interconnects, such as damascene copper, have difficulty providing low electrical resistance while attaining desired narrow linewidths. Reduced linewidth and resistance requirements require thicker metal interconnects which undesirably increases capacitance between adjacent interconnects.

SUMMARY OF THE DISCLOSURE

The following presents a simplified summary in order to provide a basic understanding of one or more aspects of the disclosure. This summary is not an extensive overview of the disclosure, and is neither intended to identify key or critical elements of the disclosure, nor to delineate the scope thereof. Rather, the primary purpose of the summary is to present some concepts of the disclosure in a simplified form as a prelude to a more detailed description that is presented later.

A microelectronic device includes an electrical conductor which includes a graphene heterolayer. The graphene heterolayer includes a plurality of alternating layers of graphene and barrier material. Each layer of the graphene has one to two atomic layers of graphene. Each layer of the barrier material has one to three layers of hexagonal boron nitride, cubic boron nitride, and/or aluminum nitride.

DETAILED DESCRIPTION OF EXAMPLE EMBODIMENTS

The present disclosure is described with reference to the attached figures. The figures are not drawn to scale and they are provided merely to illustrate the disclosure. Several aspects of the disclosure are described below with reference to example applications for illustration. It should be understood that numerous specific details, relationships, and methods are set forth to provide an understanding of the disclosure. One skilled in the relevant art, however, will readily recognize that the disclosure can be practiced without one or more of the specific details or with other methods. In other instances, well-known structures or operations are not shown in detail to avoid obscuring the disclosure. The present disclosure is not limited by the illustrated ordering of acts or events, as some acts may occur in different orders and/or concurrently with other acts or events. Furthermore, not all illustrated acts or events are required to implement a methodology in accordance with the present disclosure.

The following co-pending patent application is related and hereby incorporated by reference: U.S. patent application Ser. No. 15/438,174, filed simultaneously with this application). With its mention in this section, this patent application is not admitted to be prior art with respect to the present invention.

A microelectronic device includes an electrical conductor which includes a graphene heterolayer. The graphene heterolayer includes a plurality of alternating layers of graphene and barrier material. Each layer of graphene has one to two atomic layers of graphene. Each layer of barrier material has one to three layers of hexagonal boron nitride, cubic boron nitride, and/or aluminum nitride. The graphene heterolayer may be continuous across the electrical conductor or may be disposed in a nanoparticle film.

The layers of barrier material may match the crystal structure of the graphene so that the graphene has a high electron mobility. Alternating the layers of graphene and the layers of barrier material may enable forming an electrical conductor with the high mobility of the graphene, contacting materials of the microelectronic device which would otherwise degrade the graphene mobility if these materials contacted the planar surfaces of the graphene directly. Furthermore, alternating the layers of graphene and the layers of barrier material may enable each of the graphene layers in the graphene heterolayer to have an electron mobility close to a mobility of a single atomic layer of graphene. Electron mobility tends to degrade when multiple atomic layers of graphene are stacked together.

The graphene may be doped to attain a desired conductivity type and sheet resistance. For example, the graphene may be doped with boron, gallium, indium, silicon, germanium, nitrogen, phosphorus, arsenic, antimony, and/or oxygen. The graphene may be functionalized to provide a desired physical or chemical sensitivity. For example, the graphene may be functionalized with chemical reagents such as halogens, noble metals, hydroxyl groups, and/or organic molecules. The electrical conductor may include other electrically conductive material in addition to the graphene heterolayer.

For the purposes of this disclosure, the term "instant top surface" of a microelectronic device is understood to refer to a top surface of the microelectronic device which exists at the particular step being disclosed. The instant top surface may change from step to step in the formation of the microelectronic device.

For the purposes of this disclosure, the term "lateral" is understood to refer to a direction parallel to a plane of the instant top surface of the microelectronic device the term "vertical" is understood to refer to a direction perpendicular to the plane of the instant top surface of the microelectronic device.

It is noted that terms such as top, bottom, front, back, over, above, under, and below may be used in this disclosure. These terms should not be construed as limiting the position or orientation of a structure or element, but should be used to provide spatial relationship between structures or elements.

Figure 1:
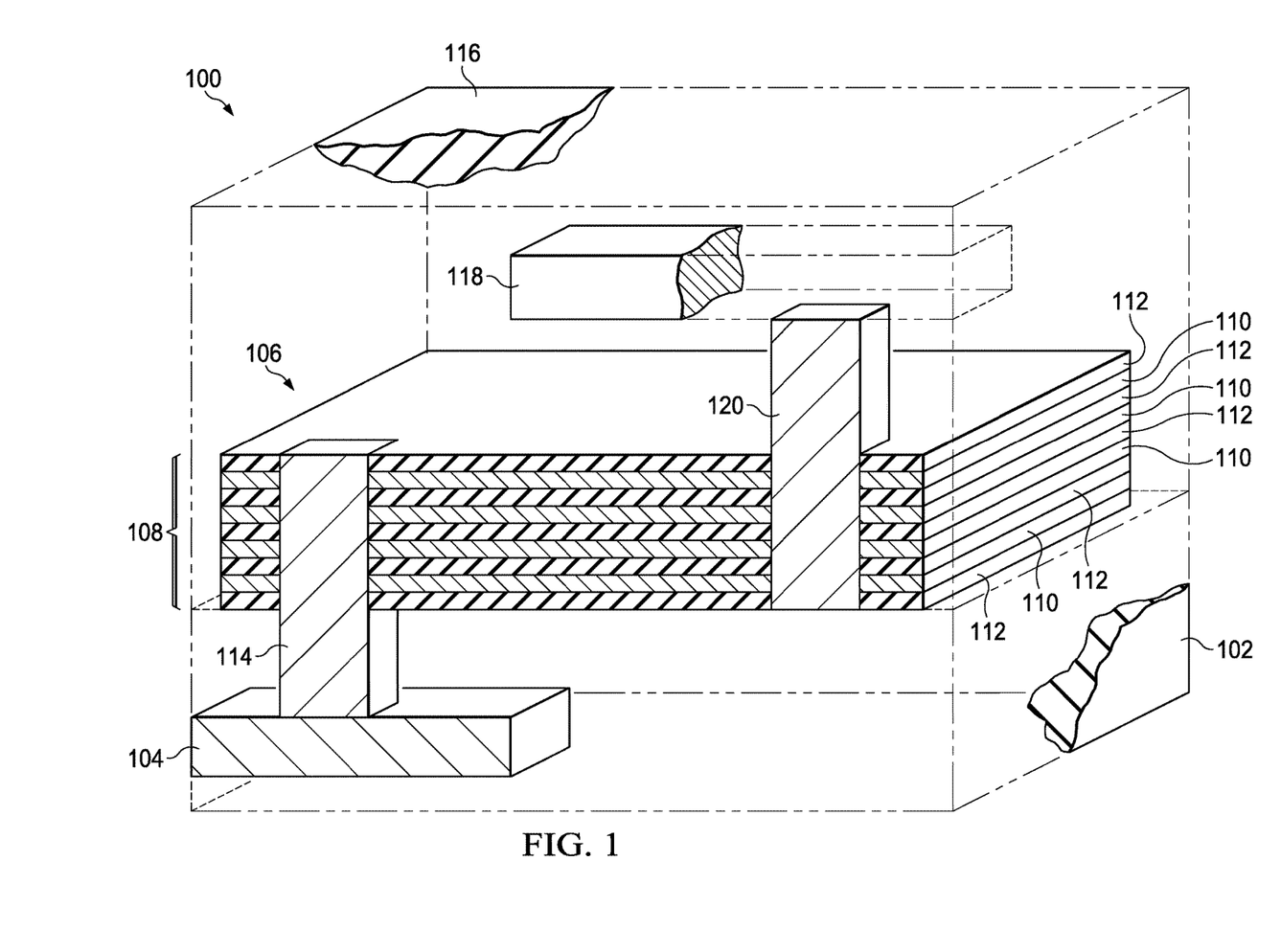
FIG. 1 is a cross section of an example microelectronic device containing an electrical conductor including a graphene heterolayer.

FIG. 1 is a cross section of an example microelectronic device containing an electrical conductor including a graphene heterolayer. The microelectronic device 100 includes a substrate 102 which may include a dielectric material of an interconnect region. The dielectric material may include one or more sublayers of silicon dioxide-based dielectric material such as silicon dioxide formed from tetraethyl orthosilicate (TEOS), low-k dielectric material formed from methyl silsesquioxane (MSQ) or hydrogen silsesquioxane (HSQ), organo-silicate glass (OSG), phosphorus silicate glass (PSG), boron phosphorus silicate glass (BPSG), or the like. The dielectric material may further include one or more sublayers of silicon nitride, silicon oxynitride, silicon carbide, silicon carbide nitride, or the like, as cap layers and/or etch stop layers. The dielectric material may include one or more sublayers of organic dielectric material such as polyimide, benzo-cyclobutene (BCB) or the like.

A lower interconnect 104 may optionally be disposed in the substrate 102. The lower interconnect 104 may be, for example, an aluminum interconnect, a damascene copper interconnect, or a plated copper interconnect. An aluminum lower interconnect 104 may include an aluminum layer with a few percent silicon, titanium, and/or copper, possibly on an adhesion layer including titanium, and possibly with an anti-reflection layer of titanium nitride on the aluminum layer. A damascene copper lower interconnect 104 may include copper on a barrier layer of tantalum and/or tantalum nitride, disposed in a trench in the dielectric material. A plated copper lower interconnect 104 may include an adhesion layer at a bottom of the lower interconnect 104, and may have a barrier layer disposed on the sides of the lower interconnect 104. Other structures and metals for the lower interconnect 104 are within the scope of the instant example.

An electrical conductor 106, that includes a graphene heterolayer 108, is disposed over the substrate 102. The graphene heterolayer 108 includes alternating layers of graphene 110 and layers of a barrier material 112. Each layer of graphene 110 has one to two atomic layers of graphene. Each layer of the barrier material 112 has one to three layers of hexagonal boron nitride, cubic boron nitride, and/or aluminum nitride. A thickness of the graphene heterolayer 108 is exaggerated in FIG. 1 to show the alternating layers of graphene 110 and layers of a barrier material 112. The layers of graphene 110 and the layers of barrier material 112 may be continuous across the electrical conductor 106, as depicted in FIG. 1. The electrical conductor 106 may be located over the lower interconnect 104, as depicted in FIG. 1.

A lower via 114 may be disposed through the graphene heterolayer 108 and extend to the lower interconnect 104, thus providing an electrical connection between the electrical conductor 106 and the lower interconnect 104. By extending through the graphene heterolayer 108, the lower via 114 makes electrical contact to the layers of graphene 110. The lower via 114 may include a liner of titanium and titanium nitride, and a fill metal of tungsten. Alternatively, the lower via 114 may include a liner of tantalum or tantalum nitride, and a fill metal of copper. Other structures and metals for the lower via 114 are within the scope of the instant example.

An upper dielectric layer 116 may be disposed over the electrical conductor 106 and the substrate 102. The upper dielectric layer 116 may include similar sublayers as described for the substrate 102. An upper interconnect 118 may be disposed in the upper dielectric layer 116, over the electrical conductor 106. The upper interconnect 118 may have a similar structure and composition as the lower interconnect 104. An upper via 120 may be disposed from the upper interconnect 118 through the graphene heterolayer 108, thus providing an electrical connection between the upper via 120 and the electrical conductor 106. By extending through the graphene heterolayer 108, the upper via 120 makes electrical contact to the layers of graphene 110. The upper via 120 may have a similar structure and composition as the lower via 114.

One or more of the layers of graphene 110 may be doped to attain a desired conductivity type and sheet resistance. One or more of the layers of graphene 110 may be functionalized to provide a desired physical or chemical sensitivity.

The graphene heterolayer 108 may provide a lower resistance for the electrical conductor 106 than metals used in the lower interconnect 104 and/or the upper interconnect 118, due to the high mobility of the layers of graphene 110. The electrical conductor 106 may provide an interconnect of the microelectronic device 100, a component such as an inductor, an antenna, an electromagnetic shield, or other function.

Figure 2A:
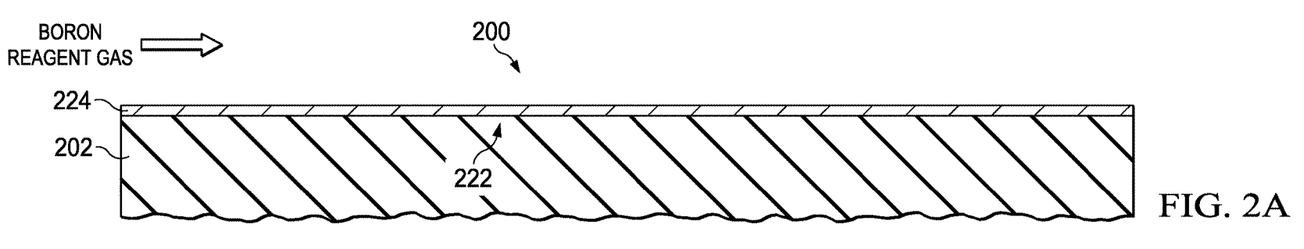
FIG. 2A through FIG. 2C are cross sections of a microelectronic device depicting successive stages of an example method of forming an electrical conductor containing a graphene heterolayer.
Figure 2B:
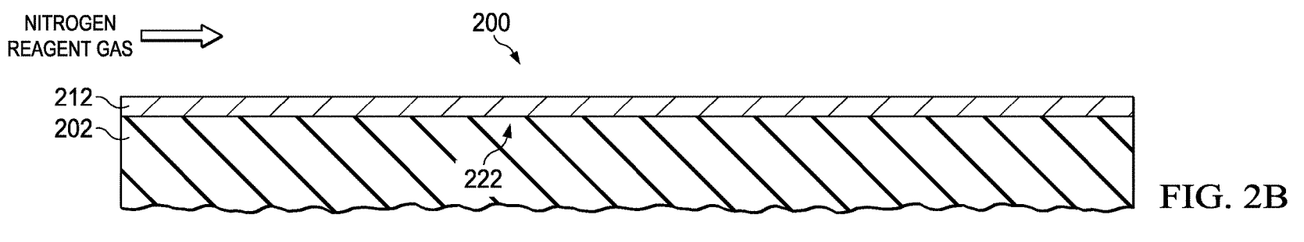
Figure 2C:
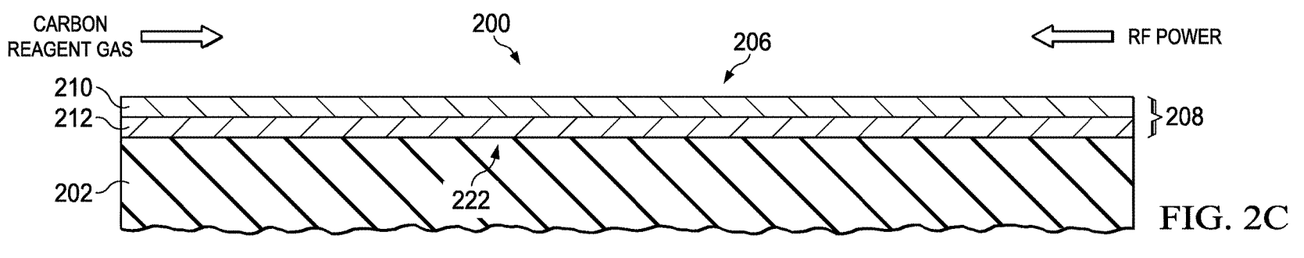

FIG. 2A through FIG. 2C are cross sections of a microelectronic device depicting successive stages of an example method of forming an electrical conductor containing a graphene heterolayer. Referring to FIG. 2A, the microelectronic device 200 includes a substrate 202. The substrate 202 may include dielectric material of an interconnect region of the microelectronic device 200 at a top surface 222 of the substrate 202. A boron reagent gas, designated as BORON REAGENT GAS in FIG. 2A, is flowed over the top surface 222. The boron reagent gas may include, for example, boron trichloride gas. The boron reagent gas forms a boron-containing layer 224 over the top surface 222 of the substrate 202. The boron-containing layer 224 may be, for example, substantially a monolayer of boron-containing molecules. Flow of the boron reagent gas is ceased after the boron-containing layer 224 is formed.

Referring to FIG. 2B, a nitrogen reagent gas, designated as NITROGEN REAGENT GAS in FIG. 2B, is flowed over the boron-containing layer 224 of FIG. 2A. The nitrogen reagent gas may include, for example, ammonia gas. Nitrogen atoms in the nitrogen reagent gas react with boron atoms in the boron-containing layer 224 to form a layer of boron nitride 212 over the top surface 222 of the substrate 202. The layer of boron nitride 212 may include hexagonal boron nitride and/or cubic boron nitride. The layer of boron nitride 212 may be, for example, substantially one molecule thick. Flow of the nitrogen reagent gas is ceased after the layer of boron nitride 212 is formed.

The steps described in reference to FIG. 2A and FIG. 2B may optionally be repeated to increase the layer of boron nitride 212 to substantially two molecules thick, or possibly three molecules thick. Alternatively, formation of the microelectronic device 200 may be continued with the layer of boron nitride 212 being substantially one molecule thick.

Referring to FIG. 2C, the substrate 202 may be heated, for example to a temperature of 200° C. to 400° C. A carbon-containing reagent gas, designated in FIG. 2C as "CARBON REAGENT GAS" is flowed over layer of boron nitride 212 and radio frequency (RF) power, designated in FIG. 2C as "RF POWER" is applied to the carbon-containing reagent gas to generate carbon radicals above the layer of boron nitride 212. The carbon-containing reagent gas may include methane, straight chain alkanes such as ethane, propane and/or butane, alcohols such as ethanol, and/or cyclic hydrocarbons such as cyclobutane or benzene. Additional gases such as hydrogen, argon and/or oxygen may also be flowed over the layer of boron nitride 212. Some carbon-containing molecules in the carbon-containing reagent gas are dissociated by the RF power, producing carbon radicals. A portion of the carbon radicals form a layer of graphene 210 on the layer of boron nitride 212. The layer of graphene 210 may be one atomic layer thick, or may be two atomic layers thick. The RF power and the flow of the carbon-containing reagent gas are ceased after the layer of graphene 210 is formed.

Alternatively, the layer of graphene 210 may be formed by a transfer process, in which graphene is formed on a suitable substrate and subsequently transferred to the microelectronic device 200. The transfer process allows a higher formation temperature for the graphene, which may provide reduced defects.

The layer of boron nitride 212 and the layer of graphene 210 are part of a graphene heterolayer 208, which is part of an electrical conductor 206 of the microelectronic device 200. The steps described in reference to FIG. 2A through FIG. 2C are repeated in sequence to form additional alternating layers of the boron nitride 212 and the layer of graphene 210 to complete the graphene heterolayer 208. The layers of graphene 210 and the layers of boron nitride 212 formed by the methods of the instant example may be continuous across the electrical conductor containing the graphene heterolayer 208.

The layers of boron nitride 212 provide a barrier material between the layers of graphene 210. In an alternate version of the instant example, the barrier material may be provided by another suitable material, that is, a material which is substantially electrically nonconductive or has a bandgap energy greater than 4 electron-volts, and has a lattice spacing close to a lattice spacing of graphene. For example, the barrier material may be provided by aluminum nitride. The method described in reference to FIG. 2A and FIG. 2B may be considered an atomic layer deposition (ALD) method. Other methods of forming the layers of barrier material are within the scope of the instant example.

The graphene heterolayer 208 may be subsequently patterned, for example by a mask and etch process, or by other methods. The graphene heterolayer 208 may provide substantially all of the electrical conductor 206.

Figure 3A:
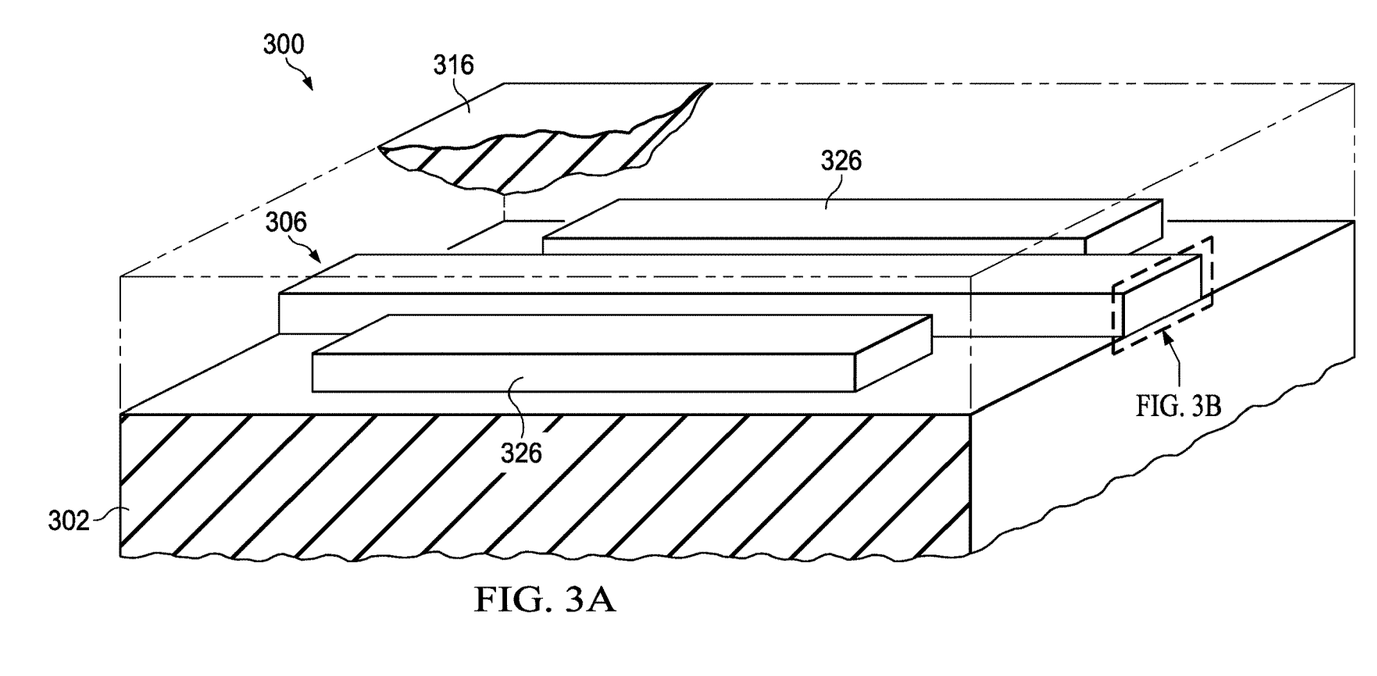
FIG. 3A and FIG. 3B are cross sections of another example microelectronic device containing an electrical conductor including a graphene heterolayer.
Figure 3B:
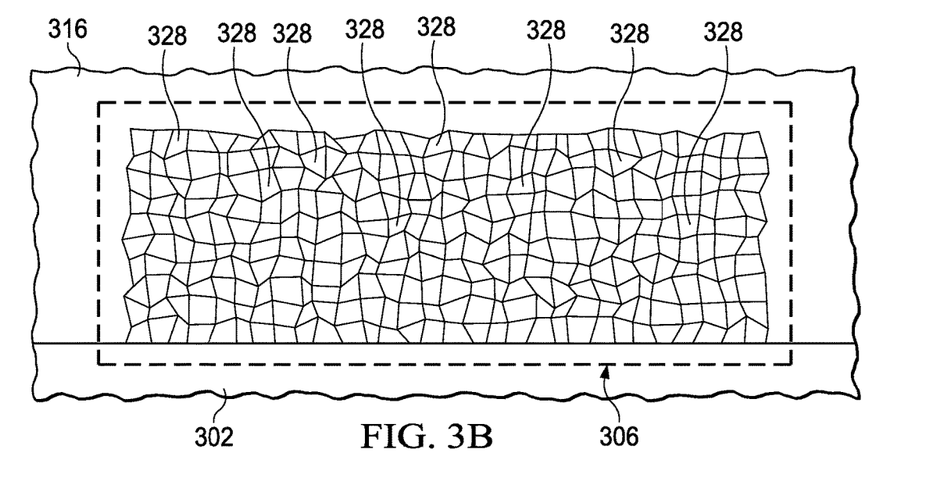

FIG. 3A and FIG. 3B are cross sections of another example microelectronic device containing an electrical conductor including a graphene heterolayer. Referring to FIG. 3A, the microelectronic device 300 includes a substrate 302, for example as described in reference to FIG. 1. An electrical conductor 306 is disposed over the substrate 302. An upper dielectric layer 316 may be disposed over the electrical conductor 306 and the substrate 302. The electrical conductor 306 may be a shielded conductor, with shield lines 326 disposed laterally adjacent to the electrical conductor 306.

Referring to FIG. 3B, in the instant example, the electrical conductor 306 includes nanoparticles 328 that include graphene heterolayers. The graphene heterolayers includes alternating layers of graphene and layers of a barrier material. Each layer of graphene has one to two atomic layers of graphene. Each layer of the barrier material has one to three layers of hexagonal boron nitride, cubic boron nitride, and/or aluminum nitride. The structure of the graphene heterolayers is similar to that depicted in FIG. 1. The nanoparticles 328 may be less than 1 micron in size. The electrical conductor 306 is substantially free of organic binder material between the nanoparticles 328. The graphene heterolayers may provide a lower electrical resistivity for the electrical conductor 306 than a metal interconnect of comparable thickness.

The shield lines 326 may have a structure similar to the structure of the electrical conductor 306. Having additional conductive lines with structures similar to the electrical conductor 306 may enable a desired circuit element, such as the shielded line depicted in FIG. 3A, without introducing significant topography in the microelectronic device 300.

Figure 4A:
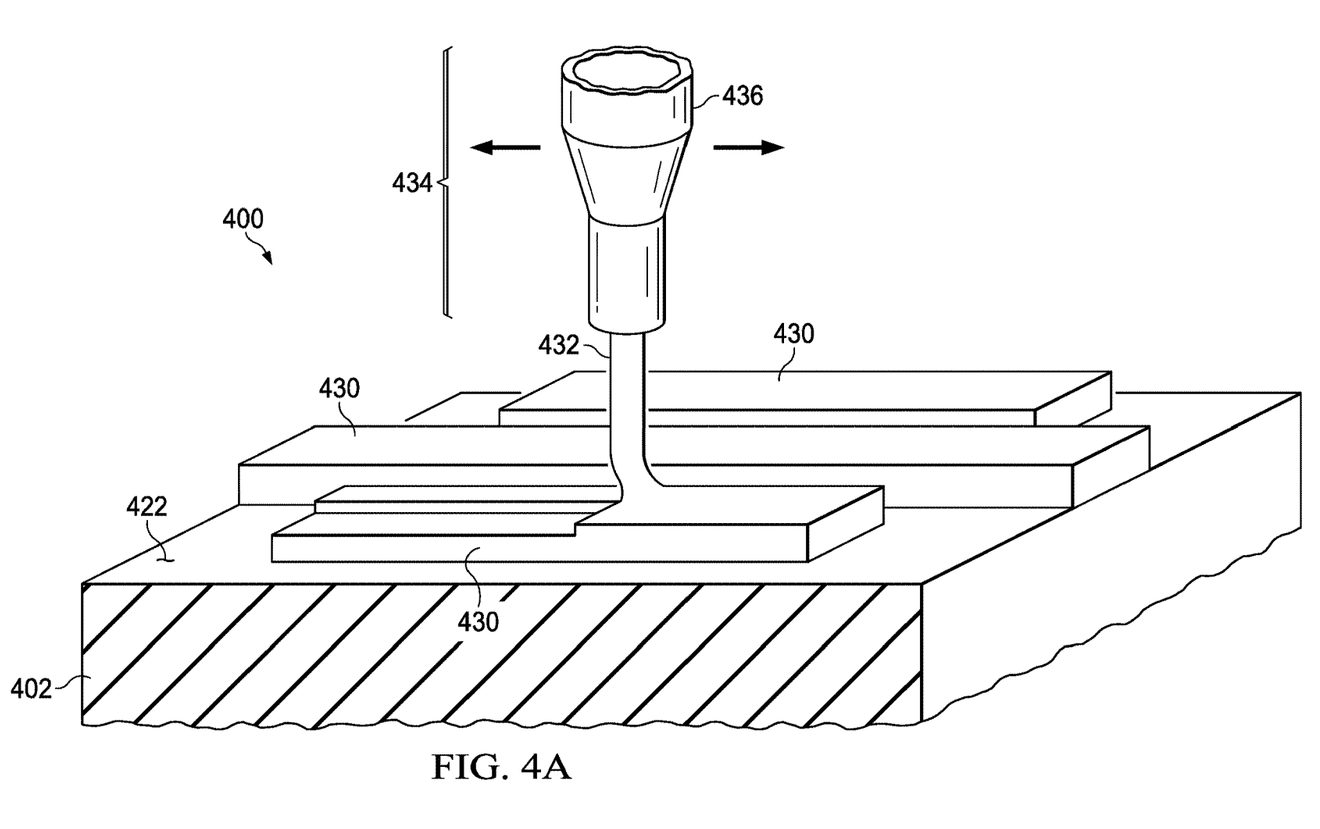
FIG. 4A and FIG. 4B are cross sections of a microelectronic device depicting successive stages of another example method of forming an electrical conductor containing a graphene heterolayer.
Figure 4B:
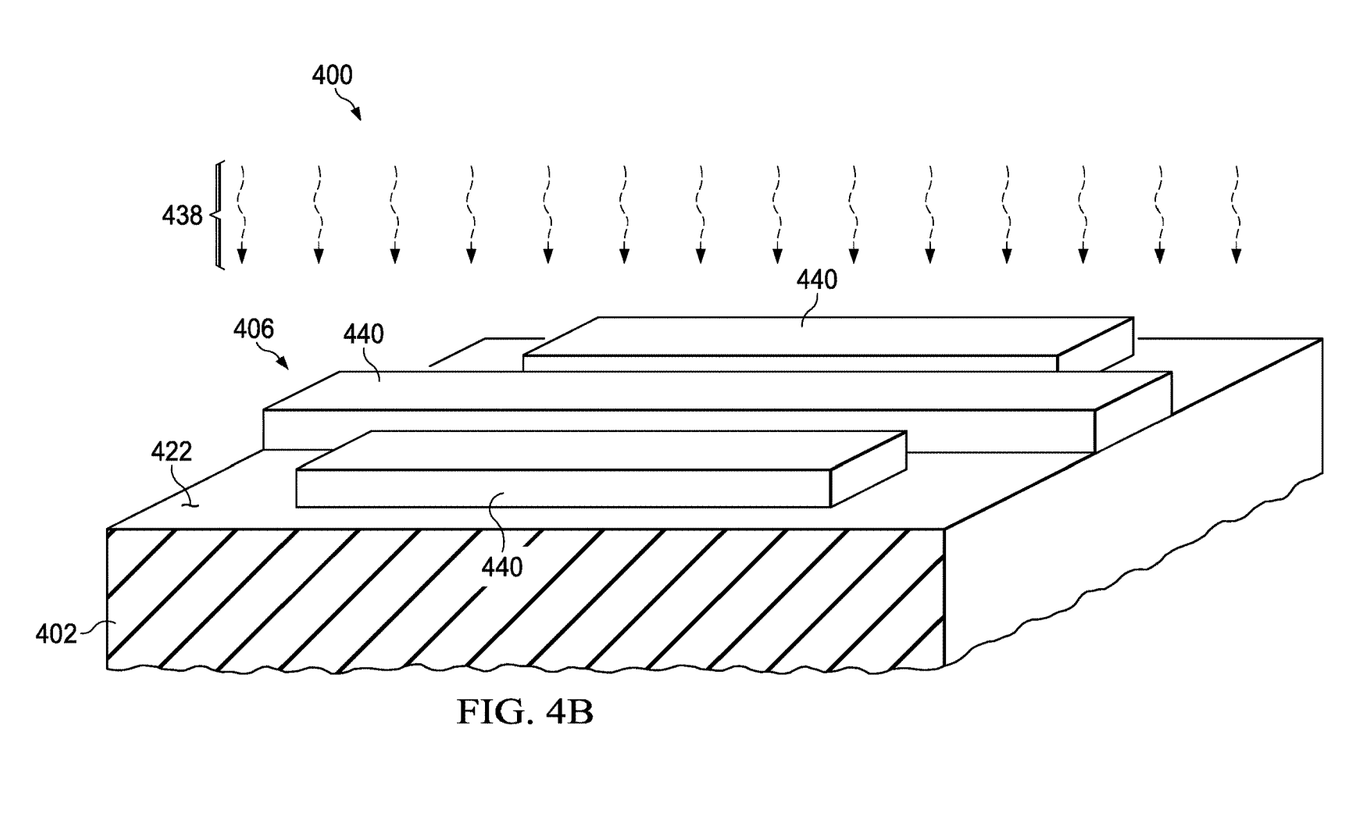

FIG. 4A and FIG. 4B are cross sections of a microelectronic device depicting successive stages of another example method of forming an electrical conductor containing a graphene heterolayer. Referring to FIG. 4A, the microelectronic device 400 includes a substrate 402. The substrate 402 may include dielectric material of an interconnect region of the microelectronic device 400 at a top surface 422 of the substrate 402. A nanoparticle ink film 430 is formed over the top surface 422 by dispensing a nanoparticle ink 432 by an additive process 434. For the purposes of this disclosure, an additive process may be understood to dispose the nanoparticles in a desired area and not dispose the nanoparticles outside of the desired area, so that it is not necessary to remove a portion of the dispensed nanoparticles to produce a final desired shape of the nanoparticles. Additive processes may enable forming films in desired areas without photolithographic processes and subsequent etch processes, thus advantageously reducing fabrication cost and complexity. The nanoparticle ink 432 includes nanoparticles and a carrier fluid. The nanoparticles include graphene heterolayers, as described in reference to FIG. 3B. The nanoparticle ink (432) may be, for example, an ink, a slurry, or a sol gel. The nanoparticle ink (432) is dispensed onto the microelectronic device (400) in an area for the subsequently-formed electrical conductor, and is not dispensed over the entire instant top surface of the substrate (402).

The additive process (434) may include, for example, a continuous extrusion process, using a continuous dispensing apparatus (436). The continuous dispensing apparatus (436) may be configured so that the microelectronic device (400) and the continuous dispensing apparatus (436) may be moved laterally with respect to each other to provide a desired dispensing pattern for the nanoparticle ink film (430). The discrete continuous dispensing apparatus (436) may have a plurality of dispensing ports which may be independently activated in parallel to provide a desired throughput for the additive process (434). In an alternate version of the instant example, the additive process (434) may include a discrete droplet process (sometimes referred to as an inkjet process), a direct laser transfer process, an electrostatic deposition process, or an electrochemical deposition process.

Referring to FIG. 4B, the nanoparticle ink film 430 of FIG. 4A is heated by a heating process 438 to remove at least a portion of a volatile material from the nanoparticle ink film 430, to form a nanoparticle film 440 which is electrically conductive. The heating process 438 may include, for example, a blanket radiant heating step using an incandescent light source, a selective radiant heating step using infrared light emitting diodes (IR LEDs) which may be programmed to apply infrared radiation to the nanoparticle ink film 430 and not to other areas of the microelectronic device 400, a hot plate heating step, and/or a forced convection heating step. The heating process 438 may be ramped from a low power to a high power, in order to remove more of the volatile material without degrading the structural integrity of the nanoparticle film 440. The nanoparticle film 440 may be further heated by a flash heating step or a spike heating step, which may further improve the electrical conductivity of the nanoparticle film 440. The nanoparticle film 440 may provide the entirety of the electrical conductor 406, as indicated in FIG. 4B. Alternatively, other electrically conductive layers may be formed on the nanoparticle film 440 to provide the electrical conductor 406.

Figure 5:
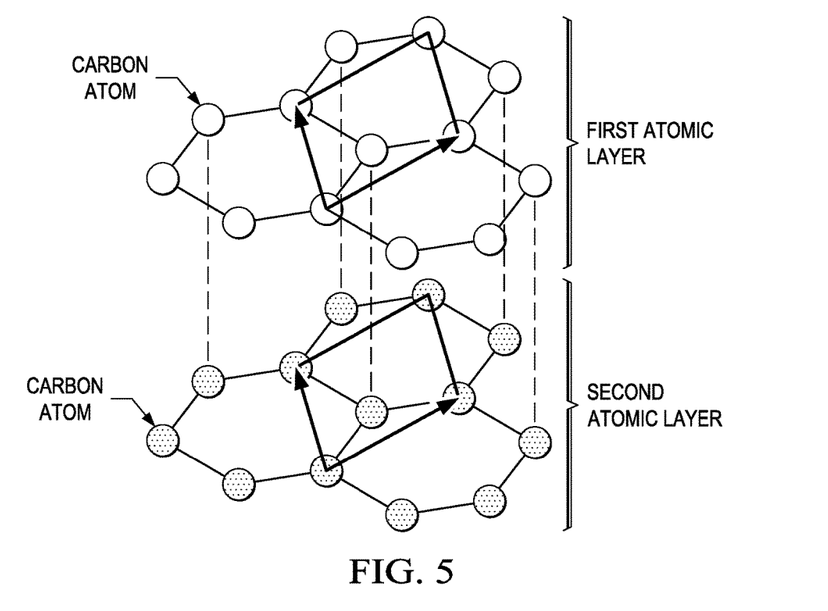
FIG. 5 is a perspective view of Bernal bilayer graphene.

FIG. 5 is a perspective view of Bernal bilayer graphene. Bernal bilayer graphene has two atomic layers of graphene. The layers of graphene in the examples disclosed herein may include Bernal bilayer graphene. A first atomic layer of graphene, designated FIRST ATOMIC LAYER in FIG. 5, contains carbon atoms, designated CARBON ATOM in FIG. 5, in a hexagonal configuration. A second atomic layer of graphene, designated SECOND ATOMIC LAYER in FIG. 5, also contains carbon atoms in a hexagonal configuration. Half of the carbon atoms in the first atomic layer are located directly over carbon atoms in the second atomic layer. Including Bernal bilayer graphene in the graphene layers of the graphene heterolayers may advantageously improve electrical conductivity of the graphene heterolayers compared to dual layers of graphene having other configurations.

Figure 6:
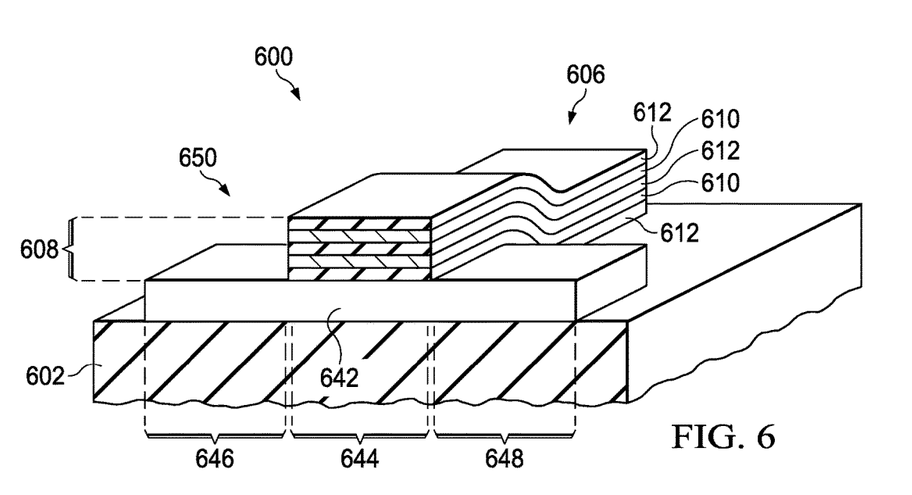
FIG. 6 is a cross section of an example microelectronic device containing an electrical conductor including a graphene heterolayer in a thin film transistor.

FIG. 6 is a cross section of an example microelectronic device containing an electrical conductor including a graphene heterolayer in a thin film transistor. The microelectronic device 600 includes a substrate 602, for example as described in reference to FIG. 1. A semiconductor layer 642 is formed over the substrate 602. The semiconductor layer 642 may include, for example, polycrystalline silicon. The semiconductor layer 642 includes a body region 644, a first source/drain region 646 laterally adjacent to the body region 644, and a second source/drain region 648 laterally adjacent to the body region 644 and opposite to the first source/drain region 646. An electrical conductor 606 including a graphene heterolayer 608 is formed over the body region 644 of the semiconductor layer 642. The graphene heterolayer 608 includes alternating layers of graphene 610 and layers of barrier material 612, as described in reference to FIG. 1. The graphene heterolayer 608 extends over the body region 644, but does not extend over the first source/drain region 646 or the second source/drain region 648. The body region 644, the first source/drain region 646, the second source/drain region 648, and the graphene heterolayer 608 over the body region 644 provide the thin film transistor 650. The graphene heterolayer 608 over the body region 644 provides a gate of the thin film transistor 650. Forming the thin film transistor 650 as described in the instant example may enable transistor functionality in an interconnect region of the microelectronic device 600 without significant increase in fabrication cost and complexity.

Figure 7:
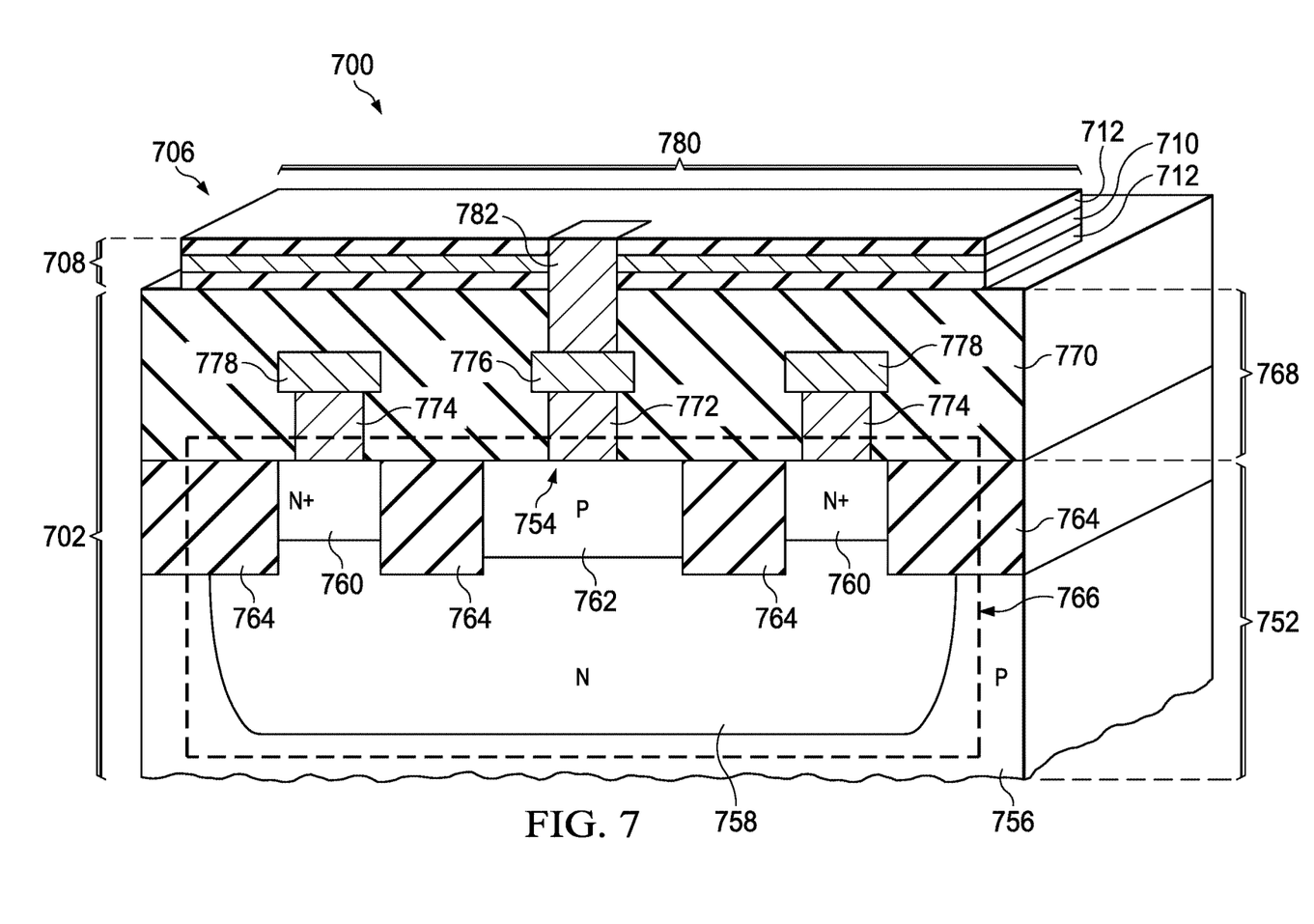
FIG. 7 is a cross section of an example microelectronic device containing an electrical conductor including a graphene heterolayer as an antenna for a bandgap convertor.

FIG. 7 is a cross section of an example microelectronic device containing an electrical conductor including a graphene heterolayer as an antenna for a bandgap convertor. The microelectronic device 700 includes a substrate 702 that includes a semiconductor layer 752 having a top surface 754. The semiconductor layer 752 includes one or more semiconductor materials with desired bandgaps. For example, the semiconductor materials may include type IV semiconductors such as silicon, germanium, silicon germanium and/or silicon carbide. The semiconductor materials may include type III-V semiconductors such as gallium nitride and/or gallium aluminum nitride. Other semiconductor materials are within the scope of the instant example. The semiconductor layer 752 includes a lower semiconductor region 756 which may be p-type as indicated in FIG. 7. A cathode well 758 is formed in the semiconductor layer 752; in the instant example, the cathode well 758 may be n-type with an average dopant density of $1 \times 10^{15}$ cm$^{-3}$ to $1 \times 10^{18}$ cm$^{-3}$. The cathode well 758 may extend 500 nanometers to 5 microns below the top surface 754 of the semiconductor layer 752. Optional n-type well contact regions 760 which may have average dopant densities of 10 to 1000 times higher than the cathode well 758, may be formed in the semiconductor layer 752, contacting the cathode well 758 and extending to the top surface 754 of the semiconductor layer 752. A p-type anode 762 is formed in the semiconductor layer 752, contacting the cathode well 758 and extending to the top surface 754 of the semiconductor layer 752. The anode 762 may have an average dopant density of $1 \times 10^{15}$ cm$^{-3}$ to $1 \times 10^{20}$ cm$^{-3}$. The anode 762 may be laterally isolated from the well contact regions 760 by isolation oxide 764 such as field oxide, formed at the top surface 754. The isolation oxide 764 may be formed, for example, by a shallow trench isolation (STI) process, or by a local oxidation of silicon (LOCOS) process. The anode 762 and the cathode well 758 provide the bandgap converter 766 of the microelectronic device 700.

An interconnect region 768 is formed over the semiconductor layer 752. The interconnect region 768 includes a dielectric layer stack 770 which may include one or more sublayers of silicon dioxide-based dielectric material to provide interlevel dielectric (ILD) sublayers and intrametal dielectric (IMD) sublayers. The dielectric layer stack 770 may further include one or more sublayers of other dielectric materials as cap layers and/or etch stop layers.

A plurality of contacts are formed in the dielectric layer stack 770 to provide electrical connections to components of the microelectronic device 700 disposed in the semiconductor layer 752. The contacts include an anode contact 772 that makes an electrical connection to the anode 762 of the bandgap converter 766. The contacts further include cathode contacts 774 that make electrical connections to the cathode well 758 of the bandgap converter 766 through the well contact regions 760.

A plurality of interconnects are formed in the dielectric layer stack 770 which make electrical connections to the contacts. The interconnects include an anode interconnect 776 on the anode contact 772, and cathode interconnects 778 on the cathode contacts 774.

An electrical conductor 706 is formed on the dielectric layer stack 770 to provide an antenna 780 for the bandgap converter 766. The electrical conductor 706 includes a graphene heterolayer 708 with alternating layers of graphene 710 and layers of a barrier material 712. The graphene heterolayer 708 may be formed according to any of the examples disclosed herein. A via 782 is formed through the graphene heterolayer 708 and through a portion of the dielectric layer stack 770 to make an electrical connection to the anode interconnect 776, so that the antenna 780 is electrically coupled to the anode 762. During operation of the microelectronic device 700, electromagnetic waves may be converted to oscillating electrical signals by the antenna 780, coupled to the bandgap converter 766 by the via 782, the anode interconnect 776 and the anode contact 772; the bandgap converter subsequently converts the oscillating electrical signals to rectified electrical signals, which may be processed by other circuits of the microelectronic device 700.

Figure 8A:
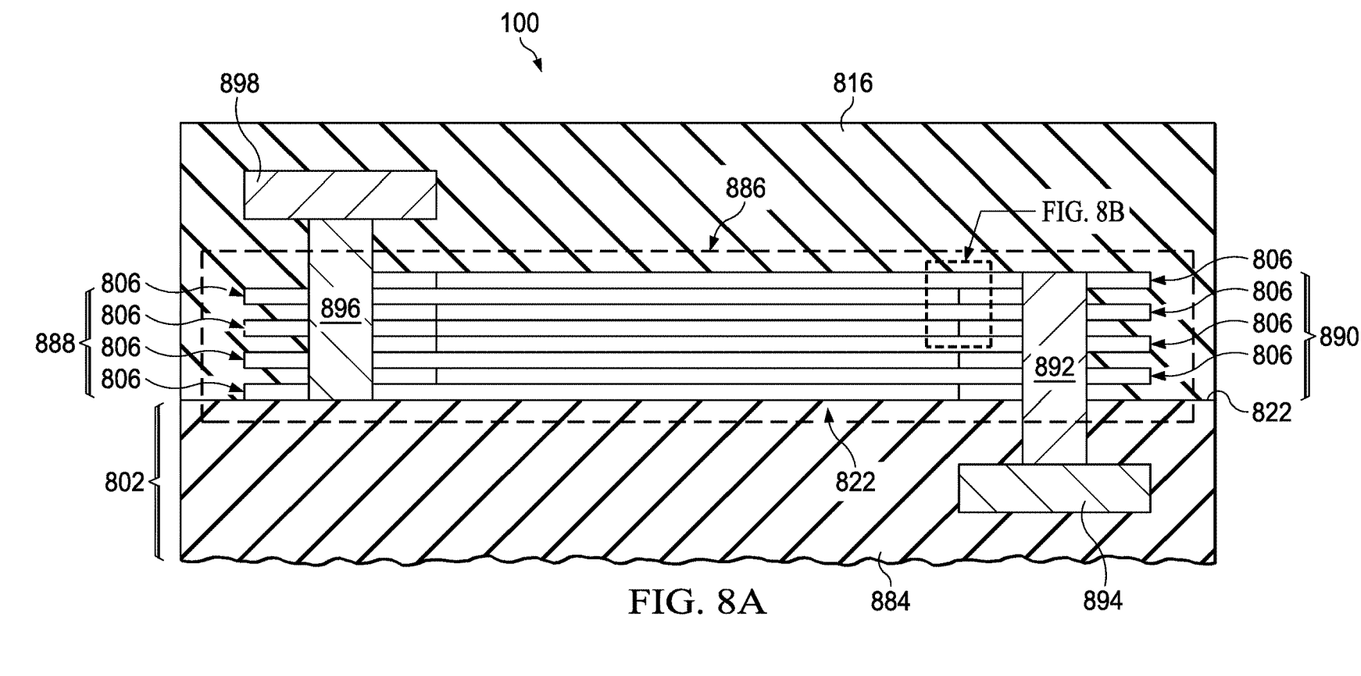
FIG. 8A and FIG. 8B are cross sections of an example microelectronic device containing a plurality of electrical conductors, each including a graphene heterolayer, providing a capacitor.
Figure 8B:
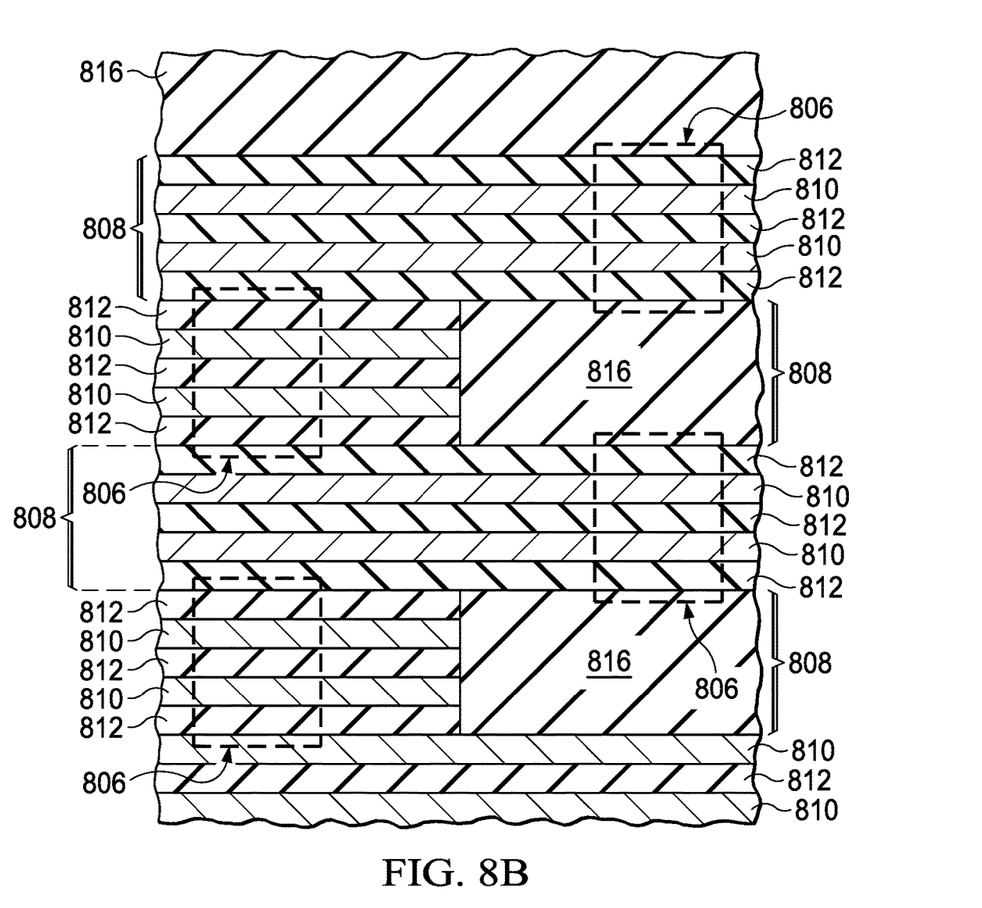

FIG. 8A and FIG. 8B are cross sections of an example microelectronic device containing a plurality of electrical conductors, each including a graphene heterolayer, providing a capacitor. Referring to FIG. 8A, the microelectronic device 800 includes a substrate 802. The substrate 802 may include a semiconductor layer with active components. The substrate 802 includes dielectric material 884 extending to a top surface 822 of the substrate 802. The dielectric material 884 may include isolation oxide such as field oxide, or may include one or more dielectric sublayers of a dielectric layer stack of an interconnect region of the microelectronic device 800. A plurality of electrical conductors 806 are formed over the substrate 802 to provide a capacitor 886.

The structure of the electrical conductors 806 is shown in more detail in FIG. 8B. Each electrical conductor 806 includes a graphene heterolayer 808. Each graphene heterolayer 808 includes a plurality of alternating layers of graphene 810 and layers of a barrier material 812. Each layer of graphene 810 has one to two atomic layers of graphene. Each layer of barrier material 812 has one to three layers of hexagonal boron nitride, cubic boron nitride, and/or aluminum nitride. The graphene heterolayers 808 may be continuous, as depicted in FIG. 8B, or may be disposed in a nanoparticle film. The graphene heterolayers 808 may be formed according to any of the examples disclosed herein. A first subset 888 of the graphene heterolayers 808 provides a first set of plates of the capacitor 886, and a second subset 890 of the graphene heterolayers 808 provides a second set of plates of the capacitor.

Referring back to FIG. 8A, an upper dielectric layer stack 816 is formed over the capacitor 886. Electrical connections to the capacitor 886 may be provided by vias. For example, a first via 892 may be formed through the first subset 888 of the graphene heterolayers 808, and extend down to a first interconnect 894 formed in the substrate 802, and a second via 896 may be formed through the second subset 890 of the graphene heterolayers 808, and extend up to a second interconnect 898 formed in the upper dielectric layer stack 816. Forming the first via 892 to extend through the graphene heterolayers 808 in the first subset 888 may advantageously provide electrical connections to each graphene layer 810, and similarly for the second via 896, may thus provide a desired total capacitance for the capacitor 886. Other structures for making electrical connections to the capacitor 886 are within the scope of the instant example.

Figure 9A:
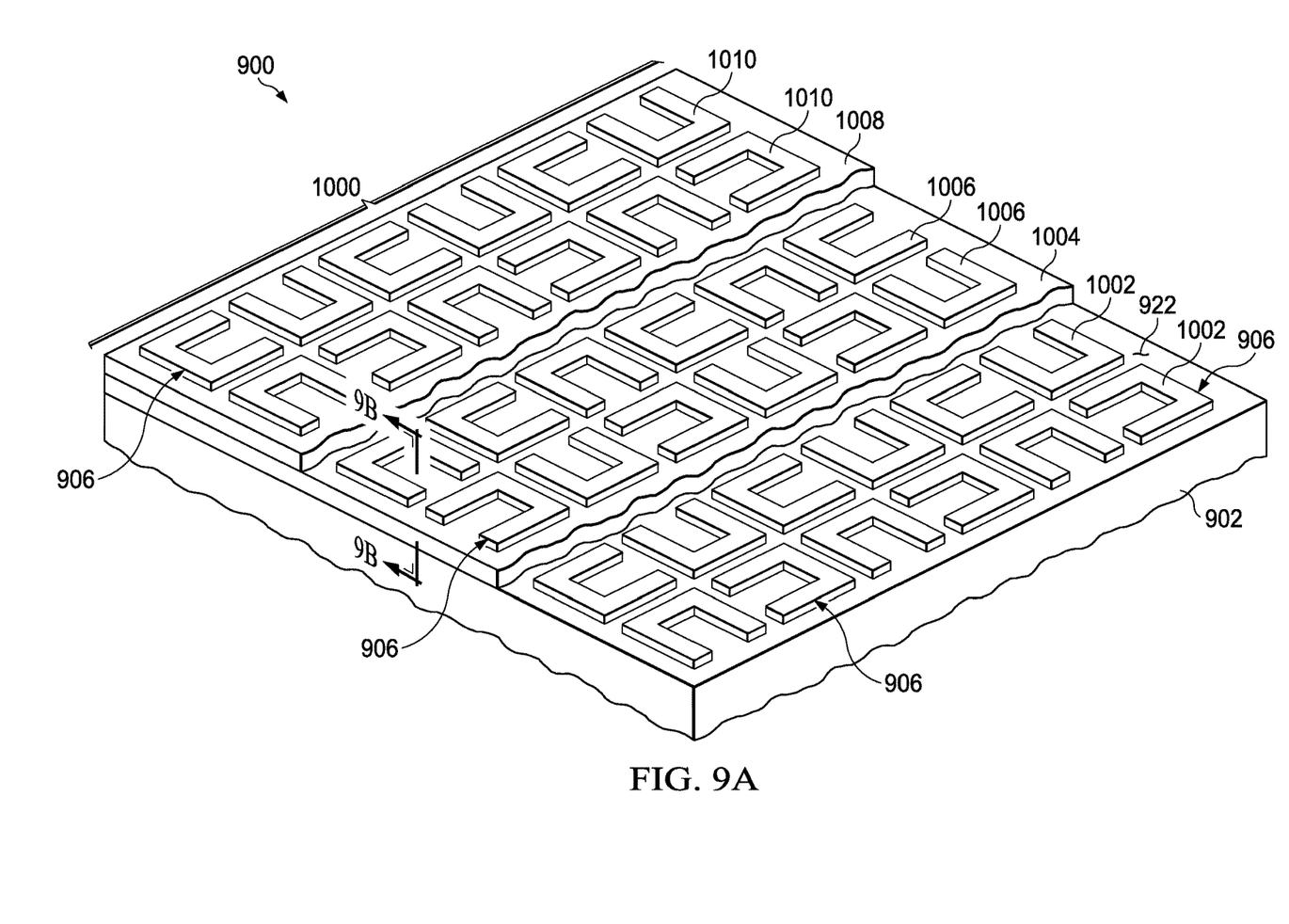
FIG. 9A and FIG. 9B are cross sections of an example microelectronic device containing a plurality of electrical conductors, each including a graphene heterolayer, to provide a meta-material structure.
Figure 9B:
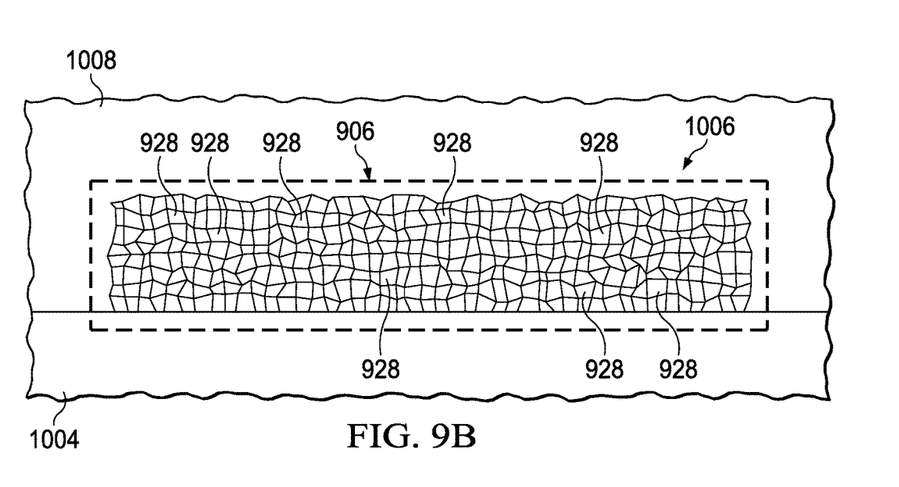

FIG. 9A and FIG. 9B are cross sections of an example microelectronic device containing a plurality of electrical conductors, each including a graphene heterolayer, to provide a meta-material structure. Referring to FIG. 9A, the microelectronic device 900 includes a substrate 902, which may include a dielectric material extending to a top surface 922 of the substrate 902. The meta-material structure 1000 is formed over the top surface 922. A first level of split-ring resonators 1002 is formed over the top surface 922. Each split-ring resonator 1002 is an electrical conductor 906 having a graphene heterolayer. Each graphene heterolayer includes alternating layers of graphene and layers of a barrier material. Each layer of graphene has one to two atomic layers of graphene. Each layer of the barrier material has one to three layers of hexagonal boron nitride, cubic boron nitride, and/or aluminum nitride. The split-ring resonators 1002 may be referred to as meta-atoms.

A first dielectric isolation layer 1004 is formed over the first level of split-ring resonators 1002 and the substrate 902. The first dielectric isolation layer 1004 may include inorganic material such as silicon dioxide-based material, and/or may include organic material such as polyimide or BCB. The first dielectric isolation layer 1004 may be formed using a spin coat process to produce a substantially planar layer, or may be formed using a conformal deposition process and subsequently planarized, for example using a chemical mechanical polish (CMP) process.

A second level of split-ring resonators 1006 is formed over the first dielectric isolation layer 1004 and over the first level of split-ring resonators 1002. Each split-ring resonator 1006 is an electrical conductor 906 having a graphene heterolayer. Each graphene heterolayer includes alternating layers of graphene and layers of a barrier material. The layers of graphene and the layers of the barrier material have the properties described in reference to the first level of split-ring resonators 1002.

A second dielectric isolation layer 1008 is formed over the second level of split-ring resonators 1006 and the first dielectric isolation layer 1004. The second dielectric isolation layer 1008 may be formed by a similar process as the first dielectric isolation layer 1004, and may have a similar composition and a similar structure.

A third level of split-ring resonators 1010 is formed over the second dielectric isolation layer 1008 and over the second level of split-ring resonators 1006. Each split-ring resonator 1010 is an electrical conductor 906 having a graphene heterolayer. Each graphene heterolayer includes alternating layers of graphene and layers of a barrier material. The layers of graphene and the layers of the barrier material have the properties described in reference to the first level of split-ring resonators 1002.

Additional dielectric isolation layers and additional levels of split-ring resonators may be formed over the third level of split-ring resonators 1010. The levels of split-ring resonators provide the meta-material structure 1000. The meta-material structure 1000 may absorb electromagnetic radiation in a desired band of wavelengths, or may exhibit a desired response to the electromagnetic radiation, such as negative refraction. Other types of meta-atoms may be used in the meta-material structure 1000 besides the split-ring resonators 1002, 1006, and 1010 to achieve desired properties of the meta-material structure 1000.

Referring to FIG. 9B, which is a cross section of one of the third level of split-ring resonators 1006, the electrical conductor 906 includes nanoparticles 928 that include graphene heterolayers. The graphene heterolayers includes alternating layers of graphene and layers of a barrier material. Each layer of graphene has one to two atomic layers of graphene. Each layer of the barrier material has one to three layers of hexagonal boron nitride, cubic boron nitride, and/or aluminum nitride. The structure of the graphene heterolayers is similar to that depicted in FIG. 1. The nanoparticles 928 may be less than 1 micron in size. The electrical conductor 906 is substantially free of organic binder material between the nanoparticles 928.

The split-ring resonators 1002 of the first level, the split-ring resonators 1006 of the second level, the split-ring resonators 1010 of the third level, and split-ring resonators in subsequent levels, may be formed by an additive process as described in reference to FIG. 4A and FIG. 4B. Using the additive process to form a plurality of levels of split-ring resonators may significantly reduce fabrication cost and complexity for the microelectronic device 900 compared to using a photolithographic process and etch process for each level.

While various embodiments of the present disclosure have been described above, it should be understood that they have been presented by way of example only and not limitation. Numerous changes to the disclosed embodiments can be made in accordance with the disclosure herein without departing from the spirit or scope of the disclosure. Thus, the breadth and scope of the present disclosure should not be limited by any of the above described embodiments. Rather, the scope of the disclosure should be defined in accordance with the following claims and their equivalents.

What is claimed is:

1. A microelectronic device, comprising:
   a substrate; and
   an electrical conductor disposed over the substrate, the electrical conductor comprising a graphene heterolayer, the graphene heterolayer comprising a plurality of alternating layers of graphene and layers of a barrier material, the layers of graphene and the layers of the barrier material being disposed in nanoparticles, wherein each layer of graphene has one to two atomic layers of graphene, and each layer of the barrier material has one to three layers selected from the group consisting of hexagonal boron nitride, cubic boron nitride, and aluminum nitride.

2. The microelectronic device of claim 1, wherein the layers of graphene include Bernal bilayer graphene.

3. The microelectronic device of claim 1, wherein the layers of graphene and the layers of the barrier material are continuous across the electrical conductor.

4. The microelectronic device of claim 1, wherein the layers of graphene are doped with an element selected from the group consisting of boron, gallium, indium, silicon, germanium, nitrogen, phosphorus, arsenic, antimony, and oxygen.

5. The microelectronic device of claim 1, wherein the layers of graphene are functionalized with chemical reagents selected from the group consisting of halogens, noble metals, hydroxyl groups, and organic molecules.

6. The microelectronic device of claim 1, wherein the electrical conductor provides an interconnect of the microelectronic device.

7. The microelectronic device of claim 1, wherein the electrical conductor provides a gate of a thin film transistor of the microelectronic device.

8. The microelectronic device of claim 1, wherein the electrical conductor provides an antenna connected to a bandgap converter of the microelectronic device.

9. The microelectronic device of claim 1, wherein the electrical conductor provides a plate of a capacitor of the microelectronic device.

10. The microelectronic device of claim 1, wherein the electrical conductor provides a meta-atom of a meta-material structure of the microelectronic device.

11. A method of forming a microelectronic device, the method comprising:
    providing a substrate;
    forming a layer of a barrier material which is continuous across an area for an electrical conductor of the microelectronic device, the layer of barrier material comprising one to three layers selected from the group consisting of hexagonal boron nitride, cubic boron nitride, and aluminum nitride;
    forming a layer of graphene which is continuous on the layer of the barrier material, wherein the layer of graphene extends across the area for the electrical conductor, and the layer of graphene includes one to two atomic layers of graphene; and
    repeating forming a layer of the barrier material which is continuous and forming a layer of graphene which is continuous, to form a graphene heterolayer of the electrical conductor, wherein the graphene heterolayer comprises a plurality of alternating layers of graphene and layers of the barrier material;
    wherein forming the layer of the barrier material includes an atomic layer deposition (ALD) process, comprising: flowing boron trichloride gas over the substrate; subsequently ceasing flow of the boron trichloride gas over the substrate; flowing ammonia gas over the substrate; and subsequently ceasing flow of the ammonia gas over the substrate.

12. The method of claim 11, wherein forming the layer of graphene includes a plasma enhanced chemical vapor deposition (PECVD) process, comprising:
    heating the substrate to a temperature of 200° C. to 400° C.;
    flowing a carbon-containing reagent gas over the substrate while the substrate is at 200° C. to 400° C.; and
    applying radio frequency (RF) power to the carbon-containing reagent gas.

13. The method of claim 12, wherein the carbon-containing reagent gas includes a gas selected from the group consisting of methane, ethane, propane, butane, ethanol, cyclobutane, and benzene.

14. The method of claim 11, wherein forming the layer of graphene includes a transfer process, comprising:
    forming the layer of graphene on a secondary substrate, separate from the substrate of the microelectronic device;
    removing the layer of graphene from the secondary substrate; and
    applying the layer of graphene to the substrate of the microelectronic device.

15. A method of forming a microelectronic device, the method comprising:
    providing a substrate; and
    forming an electrically conductive nanoparticle film of an electrical conductor of the microelectronic device, the electrically conductive nanoparticle film being essentially free of organic binder material and comprising nanoparticles that contain a graphene heterolayer, the graphene heterolayer comprising a plurality of alternating layers of graphene and layers of a barrier material, wherein each layer of graphene has one to two atomic layers of graphene, and each layer of the barrier material has one to three layers selected from the group consisting of hexagonal boron nitride, cubic boron nitride, and aluminum nitride;
    wherein forming the electrically conductive nanoparticle film includes an additive process, comprising: dispensing a nanoparticle ink containing the nanoparticles and a carrier fluid onto the substrate to form a nanoparticle ink film in an area for the electrical conductor, by an additive process; and heating the nanoparticle ink film to remove at least a portion of a volatile material from the nanoparticle ink film.

16. The method of claim 15, wherein the additive process is selected from the group consisting of a discrete droplet dispense process, a continuous extrusion process, a direct laser transfer process, an electrostatic deposition process, and an electrochemical deposition process.

\* \* \* \* \*